United States Patent [19]

Rottner et al.

[11] Patent Number: 5,674,765
[45] Date of Patent: Oct. 7, 1997

[54] METHOD FOR PRODUCING A SEMICONDUCTOR DEVICE BY THE USE OF AN IMPLANTING STEP

[75] Inventors: Kurt Rottner; Adolf Schöner, both of Kista, Sweden

[73] Assignee: ABB Research Ltd., Zurich, Switzerland

[21] Appl. No.: 636,952

[22] Filed: Apr. 24, 1996

[51] Int. Cl.⁶ .................................. H01L 21/266
[52] U.S. Cl. ............................. 437/39; 437/100
[58] Field of Search ..................... 437/39, 100, 149, 437/150, 175; 148/DIG. 20, DIG. 148

[56] References Cited

U.S. PATENT DOCUMENTS

| | | | |
|---|---|---|---|
| 4,775,882 | 10/1988 | Miller et al. | 257/559 |
| 4,945,394 | 7/1990 | Palmour et al. | 437/100 |
| 4,947,218 | 8/1990 | Edmond et al. | 437/100 |
| 5,270,554 | 12/1993 | Palmour | 437/100 |

*Primary Examiner*—Chandra Chaudhari
*Attorney, Agent, or Firm*—Pollock, Vande Sande & Priddy

[57] ABSTRACT

A method for producing a semiconductor device comprising a step a) of implanting an impurity dopant of a first conductivity type into said semiconductor layer (1) being doped according to a second opposite conductivity type for forming a first type doped surface layer (2) surrounded, except for the top surface thereof, by second conductivity type doped regions (3) of said semiconductor layer for forming a pn-junction (4) at the interface thereto. A highly doped additional semiconductor layer (5) is grown on top of said surface layer (2) for forming a contact layer allowing a low resistance ohmic contact to be established to the device so created.

14 Claims, 1 Drawing Sheet

METHOD FOR PRODUCING A SEMICONDUCTOR DEVICE BY THE USE OF AN IMPLANTING STEP

TECHNICAL FIELD OF THE INVENTION AND PRIOR ART

The present invention relates to a method for producing a semiconductor device having a semiconductor layer with a pn-junction therein, comprising a step a) of implanting an impurity dopant of a first conductivity type, one of a) n and b) p, into said semiconductor layer being doped according to a second opposite conductivity type for forming a first type doped surface layer surrounded, except for the top surface thereof, by second conductivity type doped regions of said semiconductor layer for forming a pn-junction at the interface thereto, as well as a semiconductor device produced by carrying out such a method.

Such an ion implantation technique may be used for production of all types of semiconductor devices, and all semiconductor devices having a pn-junction created by such an implantation step are comprised inspire of the presence of several further pn-junctions. Examples of such devices are different types of diodes, transistors and thyristors, and this technique allows the formation of a planar structure which is favourable in several respects, particularly for solving the passivation problem. A very high, if not the highest, electric field occurs in reverse bias of a semiconductor device, having a blocking pn-junction, in the insulator very close to the pn-junction. In mesa structured devices the intersection of the pn-junction with the interface to the passivating insulator is at the lateral mesa walls where the surface conditions are hard to control. In addition the crystallographic orientation of the interface changes gradually around the mesa. These problems do not occur in planar structures obtainable by ion implantation. However, one technological difficulty is the requirement of highly doped contact layers necessary for the formation of low resistance ohmic contacts. With ion implantation the maximum doping concentration is limited by the amorphization of the material. Thus, the maximum doping concentration obtainable by the ion implantation is considerably lower than in said mesa structures, so that the passivation problem is solved, but this has been made at the cost of a degraded contact layer of the device so created.

This overall problem is particularly pronounced in using a method defined in the introduction for the production of semiconductor devices having SiC as said semiconductor layer, since such production techniques are more developed for some other material, especially for Si, so that the present invention is particularly occupied with solving this problem for the production of semiconductor devices of SiC, where the advantages of such a planar structure is considerably greater than for especially Si due to the inherent characteristics of SiC with the ability to hold up to five times higher voltages in the blocking state of a semiconductor device made of SiC than one made of Si, which make such devices well suitable for high power applications. However, it is only possible to benefit from this excellent property of SiC to a small extent would a mesa structure pn-junction be used. Inspite of these particular advantages of the implantation technique in devices made of SiC, the invention is not in any way restricted to the use of SiC as semiconductor layer.

SUMMARY OF THE INVENTION

The object of the present invention is to provide a method of the type mentioned in the introduction through which the overall problem discussed above may be solved.

This object is in accordance with the invention obtained by providing such a method with a step b) following upon step a) and in which a highly doped additional semiconductor layer of said first conductivity type is epitaxially grown on top of said surface layer for forming a contact layer allowing a low resistance ohmic contact to be established to the device so created.

By combining this so called re-growth step with the implantation step it will be possible to take advantages of the preferred characteristics of each of said technique, so that it will be possible to locate the intersection of the pn-junction with the interface to the insulator where the surface conditions are easy to control and by the step of epitaxial growth a contact layer allowing a low resistance ohmic contact to be established to the device may also be obtained. Such an epitaxially grown contact layer can be doped much higher than an implanted layer (normally more than one order of magnitude).

According to a preferred embodiment of the invention said method is characterized by one of a) in step b) said additional semiconductor layer is grown on top of said surface layer with lateral walls thereof being surrounded by the surface contour of said surface layer with a distance therebetween for separating the pn-junction from said contact layer, and b) in step b) said additional semiconductor layer is grown on top of said semiconductor layer and after that structured so that lateral walls thereof are surrounded by the surface contour of said surface layer with a distance therebetween for separating the pn-junction from said contact layer. In this way the preferred device structure with a separation of said pn-junction from the contact layer may be obtained. Thanks to this characteristic it will be possible to keep the high electric field obtained at the surface across said pn-junction in the reverse bias state of a semiconductor device so created away from said lateral walls of the contact layer for preventing problems with leakage currents, breakdowns and destruction of the device. In addition it would be possible to cover the pn-junction where it reaches the surface with an insulating passivation layer to prevent the semiconductor device from breaking down at the surface near the pn-junction.

According to another preferred embodiment of the invention said contact layer is given a lower surface contour corresponding to a coverage of the main part of said surface layer. This will make it possible to obtain large currents in the on-state of the device and a substantially uniform distribution of the electrical field lines over said pn-junction.

According to another preferred embodiment of the invention said distance separating said pn-junction from said contact layer is selected so as to prevent the depletion region of said junction under the intended reverse bias of the semiconductor device so created from reaching said contact layer. The advantage of such a design is as already mentioned that no high electric field will occur at said lateral walls of the contact layer.

According to a further preferred embodiment of the invention said contact layer is in step b) epitaxially grown with a doping concentration above $10^{19}$ cm$^{-3}$, and according to a still more preferred embodiment of the invention above $10^{20}$ cm$^{-3}$, so that in this way by combining the epitaxial growth with the implantation technique a considerably higher doping concentration of the layer intended to serve as contact layer may be obtained than should no such step be utilised.

According to another preferred embodiment of the invention said semiconductor layer, into which it is implanted in step a) is made of SiC. Such a method is especially well suited for the production of a semiconductor device having such a semiconductor layer of SiC, since it will then be possible to have a low resistance ohmic contact thereto and still fully benefit from the property of SiC to withstand high voltages in the blocking state of such a device by said planar structure obtained for said pn-junction.

According to another preferred embodiment of the invention said contact layer is in step b) grown by epitaxy of SiC and impurity dopants. This is of course preferred when said semiconductor layer is made of SiC, since it makes it possible to grow a contact layer of a good order on said surface layer.

According to another preferred embodiment of the invention said first conductivity type dopants implanted in step a) and grown into the additional semiconductor layer in step b) are of p-type. The implantation technique is, especially for SiC as said semiconductor layer, furthest developed for acceptors, but it is emphasised that the invention is not in any way restricted to the use of p-type dopants as said first conductivity type dopants, and in fact this technique has also been successfully used for donors.

According to another preferred embodiment of the invention Al is used as impurity dopant in said additional semiconductor layer, and said contact layer is in step b) grown by epitaxy of SiC and this impurity dopant. It has turned out that very high doping concentrations with a good order of the layer grown may be obtained by using Al as impurity dopant for the epitaxial growth of SiC.

According to another preferred embodiment of the invention said additional semiconductor layer is grown by Chemical Vapour Deposition, which is a preferred and the most common technique for epitaxial growth of semiconductor layers.

According to another preferred embodiment of the invention being a development of that previously mentioned, said additional semiconductor layer is grown by heating said semiconductor layer at such a high temperature that the impurity dopants implanted in step a) are made electrically active and implantation damages are reduced. Thus, no separate annealing step is necessary, but the impurity dopants implanted in step a) will automatically become electrically active during the Chemical Vapour Deposition growth of said contact layer.

According to another preferred embodiment of the invention, in which said semiconductor layer and said additional semiconductor layer are made of SiC, said temperature is higher than 1500° C., which will ensure a good annealing of said surface layer created by the implantation step.

Another object of the present invention is to provide a semiconductor device having a good ohmic contact and a pn-junction formed by the planar structure, and this object is in accordance with the invention obtained by providing a semiconductor device according to the independent appended device claim. The advantages thereof are the same as discussed for the corresponding method claims.

Further preferred features and advantages of the invention will appear from the following description and the other dependent claims.

BRIEF DESCRIPTION OF THE DRAWINGS

With reference to the appended drawings, below follows a specific description of a preferred embodiment of the invention cited as an example.

In the drawings.

DETAILED DESCRIPTION OF A PREFERRED EMBODIMENT OF THE INVENTION

Figure 1:
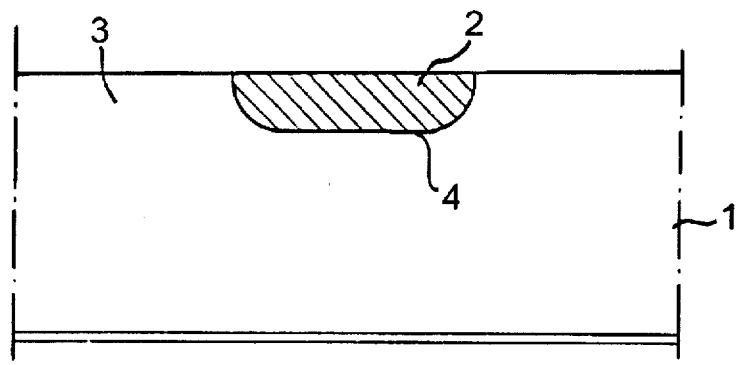
FIG. 1–4 illustrates very schematically the most important steps in a method for producing a semiconductor device according to a preferred embodiment of the invention.
Figure 2:
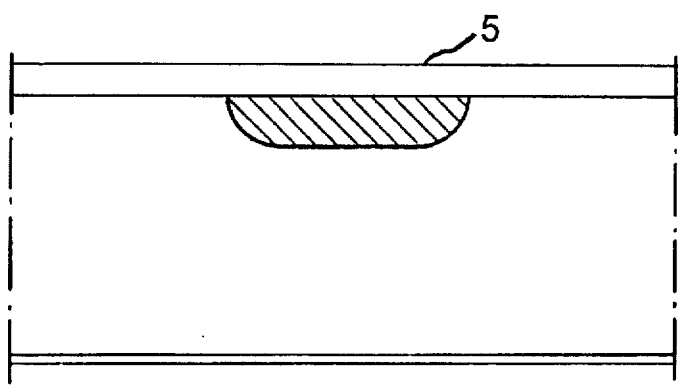

The method of which the most important steps are illustrated in FIGS. 1–4, does of course also comprise several further steps of conventional type, such as masking, demasking, passivation and so on, but these have nothing to do with the inventional idea and have therefore been left out for the sake of clearness. Furthermore, the figures are very schematic and does not show for instance passivation layers or masking layers, which may be there. Furthermore, only the semiconductor layer into which it is implanted has been shown in the figures, but the semiconductor device created by this method will almost always have further layers thereunder or therebeside.

It is started with a semiconductor layer 1, which in this case is made of SiC and is low doped with n-type impurity dopants for forming a drift layer of the device to be produced.

In a step a) the surface of the SiC semiconductor layer 1 is exposed to a bombardment of ions of p-type, such as for instance aluminium or boron. The energy used for the bombardment of said surface by the ions is preferably in the range of 100 KeV–300 KeV. A thin surface layer 2 having a thickness in the region of tenth of μm with a concentration of dopants between $10^{15}$–$10^{19}$ cm$^{-3}$ is in this way created. These dopants are still not electrically active after this implantation step, and the semiconductor layer has to be heated to a temperature above 1500° C. for obtaining such activation of the p-type dopants. It is evident that a suitable mask has been used, for instance of gold, for obtaining the lateral limitation of the surface layer 2 shown in FIG. 1. The layer 3 of the semiconductor layer 1 located thereunder will accordingly be n-type doped, so that a pn-junction 4 is formed at the interface between the two layers 2 and 3. Thus, a planar pn-junction is formed in this way.

In a second step a thin highly doped additional semiconductor layer 5 is epitaxially grown on top of the semiconductor layer 1, and this is accomplished by using the so called Chemical Vapour Deposition technique, during which the semiconductor layer 1 is heated at a temperature above 1500° C., through which the impurity dopants implanted in said surface layer 2 will be made electrically active. This high temperature is also needed for cracking the precursor gases used for the epitaxial growth of SiC of the layer 5. In this way a highly doped epitaxial layer of SiC may be grown. This layer may have a doping concentration above $10^{20}$ cm$^{-3}$ and more exactly a concentration of approximately $10^{21}$ cm$^{-3}$ may be obtained, which is well more than one order of magnitude higher than may be obtained by the implantation technique. Preferably aluminium is used as impurity dopant grown into said additional semiconductor layer 5, but also other elements are conceivable.

Figure 3:
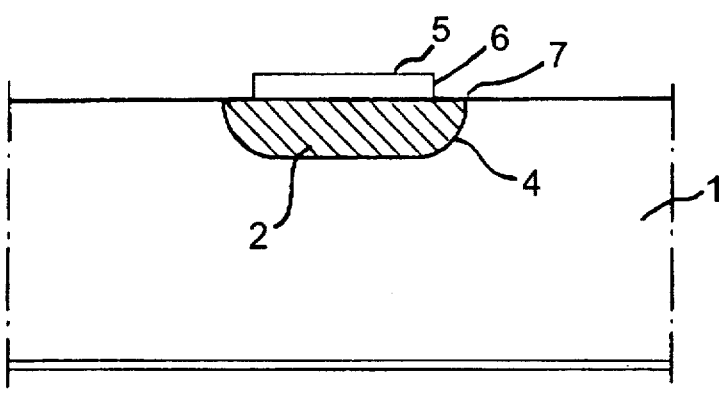

After said step of epitaxial growth said additional semiconductor layer 5 is structured by for instance RIE, so that it receives the lateral extension shown in FIG. 3 with lateral walls 6 thereof surrounded by the surface contour 7 of the surface layer 2 with a distance therebetween for separating the pn-junction 4 from the layer 5.

Figure 4:
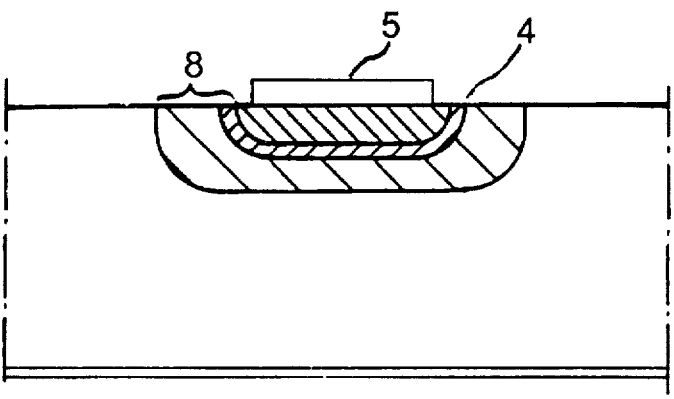

It is illustrated in FIG. 4 how the depletion region 8 created at both sides of said pn-3unction 4 will not reach the contact layers 5 when the semiconductor device so created is reverse biased. Accordingly, no high electric field will occur at said lateral walls 6, and the area of the pn-interface, at which a high electric field is present, will be located entirely in the semiconductor material, so that the advantages of a high field strength material like SiC can be utilized.

The drift layer 3 of such a device will take the main part of the voltage in the blocking state of such a semiconductor device, and this has preferably also at least a highly doped substrate layer directly under the drift layer 3 or with other layers therebetween for forming a good ohmic contact at the opposite side of the device to said contact layer 5.

The invention is of course not in any way restricted to the preferred embodiment described above, but many possibilities to modifications thereof would be apparent to a man with ordinary skill in the art without departing from the basic idea of the invention.

It may for instance be mentioned that although the dopants in said surface layer and said contact layer are of the same conductivity type, it is well possible to have different dopants in these two layers.

When it is said that the semiconductor device has a semiconductor layer of SiC it does not necessarily mean that the semiconductor device has SiC as the only semiconductor material, but only the region in which the implantation takes place and in which a pn-junction is formed has then to be of SiC and the device may have hetero-character should this be desired.

Furthermore, the pn-junction will in practise move a little bit into the semicondutor layer when this is heated during the step of epitaxial growth through diffusion of the implanted dopants, although this has not been illustrated in the figures.

The definition "layer" is to be interpreted broadly and comprises all types of volume extensions and shapes.

All definitions concerning the material of different layers of course also include inevitable impurities as well as intentional doping.

Although annealing is automatically obtained by the CVD regrowth step an additional annealing step may be carried out in combination with the regrowth. For instance, first an annealing step above 1700° C. is carried out for 30 min and then is the temperature reduced to 1550°–1620° C. and the growth is performed.

I claim:

1. A method for producing a semiconductor device having a semiconductor layer with a pn-junction therein, comprising the steps of:
    a) implanting an impurity dopant of a first p or n conductivity type, into said semiconductor layer being of a second opposite conductivity type for forming a first conductivity type doped surface layer surrounded, except for the top surface thereof, by second conductivity type doped regions of said semiconductor layer for forming a pn-junction at the interface thereto, and
    b) following step a) epitaxially growing a highly doped additional semiconductor layer of said first conductivity type on top of said surface layer for forming a contact layer allowing a low resistance ohmic contact to be established to the device so created.

2. A method according to claim 1, wherein said step b) further comprises one of:
    c) growing said additional semiconductor layer on top of said surface layer with lateral walls thereof being surrounded by the surface contour of said surface layer with a distance therebetween for separating the pn-junction from said contact layer, and
    d) growing said additional semiconductor layer on top of said semiconductor layer and after that structuring so that lateral walls thereof are surrounded by the surface contour of said surface layer with a distance therebetween for separating the pn-junction from said contact layer.

3. A method according to claim 2, wherein said contact layer is given a lower surface contour corresponding to a coverage of the main part of said surface layer.

4. A method according to claim 2, wherein said distance separating said pn-junction from said contact layer is selected to prevent the depletion region of said junction under the intended reverse bias of the semiconductor device so created from reaching said contact layer.

5. A method according to claim 1, wherein said contact layer in step b) is epitaxially grown with a doping concentration of above $10^{19}$ cm$^{-3}$.

6. A method according to claim 1, wherein said contact layer in step b) is epitaxially grown with a doping concentration of above $10^{20}$ cm$^{-3}$.

7. A method according to claim 1, wherein said semiconductor layer is made of SiC.

8. A method according to claim 1, wherein said contact layer in step b).is grown by epitaxy of SiC and impurity dopants.

9. A method according to claim 1, wherein said first conductivity type dopants implanted in step a) and grown into the additional semiconductor layer in step b) are of p-type.

10. A method according to claim 8, wherein Al is used as an impurity dopant in said additional semiconductor layer.

11. A method according to claim 1, wherein said additional semiconductor layer is grown by Chemical Vapor Deposition (CVD).

12. A method according to claim 11, wherein said additional semiconductor layer is grown while heating said semiconductor layer at such a high temperature that the impurity dopants implanted in step a) are made electrically active and implantation damages are reduced.

13. A method according to claim 7, wherein said temperature is higher than 1500° C.

14. A method according to claim 1, wherein the implantation in step a) is carried out for obtaining a doping concentration in said surface layer of $10^{15}$–$10^{19}$ cm$^{-3}$.

* * * * *